United States Patent
Yoon et al.

(10) Patent No.: US 11,276,841 B2
(45) Date of Patent: Mar. 15, 2022

(54) LIGHT EXTRACTION SUBSTRATE FOR ORGANIC LIGHT EMITTING ELEMENT AND ORGANIC LIGHT EMITTING ELEMENT COMPRISING SAME

(71) Applicant: Corning Precision Materials Co., Ltd., Chungcheongnam-do (KR)

(72) Inventors: Hong Yoon, Chungcheongnam-do (KR); Joo Young Lee, Chungcheongnam-do (KR); Hyun Hee Lee, Chungcheongnam-do (KR); Dong Hyun Kim, Chungcheongnam-do (KR); Min Seok Kim, Chungcheongnam-do (KR); Seo Hyun Kim, Chungcheongnam-do (KR); Kwang Je Woo, Chungcheongnam-do (KR)

(73) Assignee: Corning Precision Materials Co., Ltd.

( * ) Notice: Subject to any disclaimer, the term of this patent is extended or adjusted under 35 U.S.C. 154(b) by 0 days.

(21) Appl. No.: 15/514,301
(22) PCT Filed: Sep. 18, 2015
(86) PCT No.: PCT/KR2015/009802
§ 371 (c)(1),
(2) Date: Mar. 24, 2017
(87) PCT Pub. No.: WO2016/047970
PCT Pub. Date: Mar. 31, 2016

(65) Prior Publication Data
US 2017/0279083 A1 Sep. 28, 2017

(30) Foreign Application Priority Data

Sep. 25, 2014 (KR) .................. 10-2014-0128197
Dec. 29, 2014 (KR) .................. 10-2014-0192272

(51) Int. Cl.
- *H01L 51/52* (2006.01)
- *H01L 51/00* (2006.01)
- *G02B 5/02* (2006.01)

(52) U.S. Cl.
CPC ........ *H01L 51/5268* (2013.01); *G02B 5/0242* (2013.01); *H01L 51/0096* (2013.01);
(Continued)

(58) Field of Classification Search
CPC .................. G02B 5/02; H01L 51/52
(Continued)

(56) References Cited

U.S. PATENT DOCUMENTS

| | | | | |
|---|---|---|---|---|
| 5,760,815 A | * | 6/1998 | Genovese | B41J 2/473 250/227.28 |
| 2002/0085601 A1 | * | 7/2002 | Wang | C09K 11/7774 372/43.01 |

(Continued)

FOREIGN PATENT DOCUMENTS

| JP | 2005353367 A | 12/2005 |
|---|---|---|
| KR | 1093259 | 12/2011 |

(Continued)

OTHER PUBLICATIONS

Auger, et al. "Scattering Properties of Rutile Pigments Located Eccentrically within Microvoids", 2001, Journal of Quantitative Spectroscopy & Radiative Transfer, vol. 70, pp. 675-695 (Year: 2001).*

(Continued)

*Primary Examiner* — Sheng-Bai Zhu
(74) *Attorney, Agent, or Firm* — Lerner, David, Littenberg, Krumholz & Mentlik, LLP (57) ABSTRACT

The present invention relates to a light extraction substrate for an organic light emitting element and, more specifically, to a light extraction substrate for an organic light emitting element that can enhance the light extraction efficiency of the organic light emitting element by optimizing a stack structure that can maximize scattering efficiency, and an organic light emitting element comprising the same. To this end, the present invention provides a light extraction substrate for an organic light emitting element and an organic light emitting element comprising the same, the light extraction substrate comprising: a base substrate; a plurality of light scattering objects arranged on the base substrate; a (Continued)

matrix layer formed on the base substrate to cover the plurality of light scattering objects; and a planarization layer that is formed on the matrix layer and of which the surface makes contact with an organic light emitting element, wherein at least one of the cover matrix layer, the planarization layer, and the light scattering objects has a different index of refraction.

16 Claims, 4 Drawing Sheets

(52) U.S. Cl.
CPC ...... *H01L 51/5275* (2013.01); *H01L 51/0097* (2013.01); *H01L 2251/5369* (2013.01); *Y02E 10/549* (2013.01)

(58) Field of Classification Search
USPC .................. 257/100; 359/592, 599; 438/26
See application file for complete search history.

(56) References Cited

U.S. PATENT DOCUMENTS

| | | | | |
|---|---|---|---|---|
| 2003/0111955 | A1* | 6/2003 | McNulty | H01L 51/5036 313/504 |
| 2007/0267966 | A1* | 11/2007 | Numajiri | B32B 7/02 313/502 |
| 2008/0272367 | A1* | 11/2008 | Cok | H01L 51/5253 257/40 |
| 2009/0237769 | A1* | 9/2009 | Hakii | C25D 7/00 359/270 |
| 2012/0305966 | A1* | 12/2012 | Shin | H01L 51/0096 257/98 |
| 2013/0284354 | A1 | 10/2013 | Lee et al. | |
| 2014/0014923 | A1 | 1/2014 | Jang et al. | |
| 2014/0271448 | A1* | 9/2014 | Fu | C01G 23/047 423/610 |
| 2014/0291656 | A1* | 10/2014 | Gollier | H01L 51/5253 257/40 |
| 2014/0319502 | A1* | 10/2014 | Umemoto | C09D 183/14 257/40 |
| 2014/0367672 | A1* | 12/2014 | Kim | H01L 51/5275 257/40 |
| 2015/0171372 | A1* | 6/2015 | Iwata | C09D 5/22 257/40 |

FOREIGN PATENT DOCUMENTS

| | | |
|---|---|---|
| KR | 101114916 B1 | 2/2012 |
| KR | 20140032471 A | 3/2014 |
| KR | 20140046728 A | 4/2014 |
| KR | 20140108434 A | 9/2014 |

OTHER PUBLICATIONS

International Search Report for Application No. PCT/KR2015/009802 dated Mar. 18, 2016.

\* cited by examiner

LIGHT EXTRACTION SUBSTRATE FOR ORGANIC LIGHT EMITTING ELEMENT AND ORGANIC LIGHT EMITTING ELEMENT COMPRISING SAME

CROSS-REFERENCE TO RELATED APPLICATION

This application is a national phase entry under 35 U.S.C. § 371 of International Application No. PCT/KR2015/009802, filed Sep. 18, 2015, published in Korean, which claims priority to Korean Patent Application No. 10-2014-0128197, filed on Sep. 25, 2014, and Korean Patent Application No. 10-2014-0192272, filed on Dec. 29, 2014, the disclosures of which are incorporated herein by reference.

TECHNICAL FIELD

The present disclosure relates to a light extraction substrate for an organic light-emitting diode (OLED) device and an OLED device including the same. More particularly, the present disclosure relates to a light extraction substrate for an OLED device, the light extraction substrate having an optimized multilayer structure that can maximize scattering efficiency to improve the light extraction efficiency of the OLED device, and an OLED device including the same.

BACKGROUND ART

In general, light-emitting devices may be divided into organic light-emitting diode (OLED) devices having a light-emitting layer formed from an organic material and inorganic light-emitting devices having a light-emitting layer formed from an inorganic material. In OLED devices, OLEDs are self-emitting light sources based on the radiative decay of excitons generated in an organic light-emitting layer by the recombination of electrons injected through an electron injection electrode (cathode) and holes injected through a hole injection electrode (anode). OLEDs have a range of merits, such as low-voltage driving, self-emission, a wide viewing angle, high resolution, natural color reproducibility, and rapid response times.

Recently, research has been actively undertaken into applying OLEDs to portable information devices, cameras, clocks or watches, office equipment, information display devices for vehicles or the like, televisions (TVs), display devices, lighting systems, and the like.

To improve the luminous efficiency of such above-described OLED devices, it is necessary to improve the luminous efficiency of a material of which a light-emitting layer is formed or light extraction efficiency, i.e. the efficiency with which light generated by the light-emitting layer is extracted.

The light extraction efficiency of an OLED device depends on the refractive indices of OLED layers. In a typical OLED device, when a beam of light generated by the light-emitting layer is emitted at an angle greater than a critical angle, the beam of light may be totally reflected at the interface between a higher-refractivity layer, such as a transparent electrode layer acting as an anode, and a lower-refractivity layer, such as a glass substrate. This may consequently lower light extraction efficiency, thereby lowering the overall luminous efficiency of the OLED device, which is problematic.

Described in more detail, only about 20% of light generated by an OLED is emitted from the OLED device and about 80% of the light generated is lost due to a waveguide effect originating from different refractive indices of a glass substrate, an anode, and an organic light-emitting layer comprised of a hole injection layer, a hole transport layer, an emissive layer, an electron transport layer, and an electron injection layer, as well as by the total internal reflection originating from the difference in refractive indices between the glass substrate and ambient air. Here, the refractive index of the internal organic light-emitting layer ranges from 1.7 to 1.8, whereas the refractive index of indium tin oxide (ITO), generally used in anodes, is about 1.9. Since the two layers have a significantly low thickness, ranging from 200 nm to 400 nm, and the refractive index of the glass used for the glass substrate is about 1.5, a planar waveguide is thereby formed inside the OLED device. It is calculated that the ratio of the light lost in the internal waveguide mode due to the above-described reason is about 45%. In addition, since the refractive index of the glass substrate is about 1.5 and the refractive index of ambient air is 1.0, when light exits the interior of the glass substrate, a beam of the light, having an angle of incidence greater than a critical angle, may be totally reflected and trapped inside the glass substrate. The ratio of trapped light is about 35%. Therefore, only about 20% of generated light may be emitted from the OLED device.

To overcome such problems, light extraction layers through which 80% of light that would otherwise be lost in the internal waveguide mode can be extracted have been actively researched. Light extraction layers are generally categorized as internal light extraction layers and external light extraction layers. In the case of external light extraction layers, it is possible to improve light extraction efficiency by disposing a film including microlenses on the outer surface of the substrate, the shape of the microlenses being selected from a variety of shapes. The improvement of light extraction efficiency does not significantly depend on the shape of microlenses. On the other hand, internal light extraction layers directly extract light that would otherwise be lost in the light waveguide mode. Thus, the capability of internal light extraction layers to improve light extraction efficiency may be higher than that of external light extraction layers. However, an internal light extraction layer may act contrary to this intention, when the angle of incident light is substantially perpendicular to the glass substrate. Although an internal light extraction layer may have higher light extraction efficiency than an external light extraction layer, such an internal light extraction layer may cause light loss. In addition, an internal light extraction layer must be formed during the fabrication process of an OLED device, is influenced by subsequent processing, and is difficult to form in technological terms, which are problematic.

There has been significant development in light extraction technology based on a light scattering phenomenon. In particular, internal light extraction technology, in which a light-scattering layer is sandwiched between a substrate and a transparent electrode to form an internal light extraction layer, has come to prominence. In this case, the light efficiency improving performance of the internal light extraction layer is mainly dependent on scattering efficiency produced by the scattering structure of light-scattering elements contained in the light-scattering layer. At present, active research is being undertaken into further improving scattering efficiency.

RELATED ART DOCUMENT

Korean Patent No. 1093259 (Dec. 6, 2011)

DISCLOSURE

Technical Problem

Accordingly, the present disclosure has been made in consideration of the above problems occurring in the related art, and the present disclosure proposes a light extraction substrate for an organic light-emitting diode (OLED) device, the light extraction substrate having an optimized multilayer structure that can maximize scattering efficiency to improve the light extraction efficiency of the OLED device, and an OLED device including the same.

Technical Solution

According to an aspect of the present disclosure, a light extraction substrate for an organic light-emitting diode (OLED) device may include: a base substrate; a number of light-scattering elements disposed on the base substrate; a cover matrix layer disposed on the base substrate to cover the number of light-scattering elements; and a planarization layer disposed on the cover matrix layer, with a surface thereof abutting an OLED, wherein at least one of the number of light-scattering elements, the cover matrix layer, and the planarization layer has a different refractive index.

The cover matrix layer may be formed from a material having a different refractive index from the number of light-scattering elements and the planarization layer.

The cover matrix layer may form a high refractive index matrix layer having a higher refractive index than the number of light-scattering elements and the planarization layer The cover matrix layer may be formed from a metal oxide or a high refractive index polymer.

The cover matrix layer may be formed from one or a combination of at least two selected from a group of metal oxides, consisting of $SiO_2$, $TiO_2$, $ZrO_x$, $ZnO$, and $SnO_2$.

The cover matrix layer may be formed from rutile $TiO_2$.

The cover matrix may have a number of irregular-shaped voids therein.

Sizes of the number of voids may range from 50 nm to 900 nm.

A thickness of the cover matrix layer may be lower than a thickness of the number of light-scattering elements.

A thickness of the cover matrix layer may range from 10 nm to 500 nm.

Diameters of the number of light-scattering elements may range from 50 nm to 1 μm.

The number of light-scattering elements and the planarization layer may be formed from materials having a same refractive index or materials having different refractive indices.

The number of light-scattering elements and the cover matrix layer may be formed from materials having a same refractive index. The cover matrix layer and the planarization layer may be formed from materials having different refractive indices.

The number of light-scattering elements and the cover matrix layer may be formed from materials having different refractive indices. The cover matrix layer and the planarization layer may be formed from materials having a same refractive index.

The number of light-scattering elements, the cover matrix layer, and the planarization layer may be disposed between the base substrate and the OLED to form an internal light extraction layer for the OLED.

The number of light-scattering elements may have a packing density of 40% or more within the cover matrix layer.

The number of light-scattering elements may include particles, voids, or a combination thereof.

Each of the particles may have a single refractive index or multiple refractive indices.

The number of light-scattering elements may include the particles, the particles including a combination of single refractive particles having a single refractive index and multiple refractive particles having multiple refractive indices.

Each of the multiple refractive particles may include a core and a shell surrounding the core, the shell having a different refractive index from the core.

The core may be a hollow portion.

The base substrate may be a flexible substrate.

The base substrate may be a thin glass sheet having a thickness of 1.5 mm or less.

Advantageous Effects

According to the present disclosure, at least one layer from among a number of light-scattering elements, a cover matrix, and a planarization layer is provided as a different refractive index layer. More particularly, since the cover matrix may have a higher refractive index than the number of light-scattering elements and the planarization layer and the thickness of the cover matrix having a higher refractive index can be controlled, the multilayer structure can be optimized to maximize scattering efficiency. It is thereby possible to improve the light extraction efficiency of an OLED device.

MODE FOR INVENTION

Hereinafter, a light extraction substrate for an organic light-emitting diode (OLED) device and an OLED device including the same will be described in detail with reference to the accompanying drawings.

In the following description, detailed descriptions of known functions and components incorporated herein will be omitted in the case that the subject matter of the present disclosure may be rendered unclear by the inclusion thereof.

Figure 1:
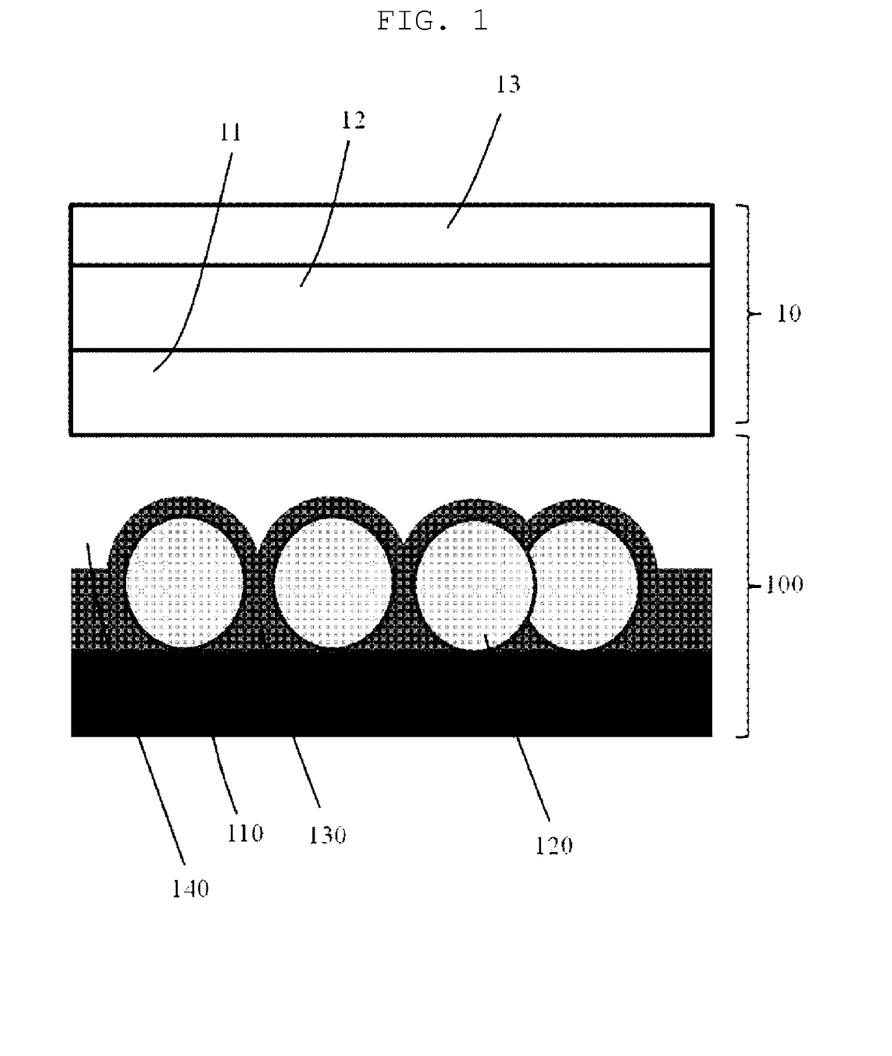
FIG. 1 is a conceptual cross-sectional view illustrating an OLED device including a light extraction substrate according to an exemplary embodiment disposed in a portion thereof, through which light generated by an OLED exits.

As illustrated in FIG. 1, a light extraction substrate 100 for an OLED device according to an exemplary embodiment is a functional substrate serving to improve the light extraction efficiency of an OLED device to improve the luminance of a lighting device in which the OLED device is used. The light extraction substrate 100 is disposed in a portion of the OLED device through which light generated by an OLED 10 exits.

The OLED 10 has a multilayer structure sandwiched between the light extraction substrate 100 according to the exemplary embodiment and another substrate (not shown) facing the light extraction substrate 100 to encapsulate the OLED 10. The multilayer structure of the OLED is comprised of a first electrode 11, an organic light-emitting layer 12, and a second electrode 13. The first electrode 11 is an electrode acting as an anode of the OLED 10. The first electrode 11 may be formed from, for example, a metal, such as Au, In, or Sn, or a metal oxide, such as indium tin oxide (ITO), having a greater work function to facilitate hole injection. The second electrode 13 is an electrode acting as a cathode of the OLED 10. The second electrode 13 may be a metal thin film formed from Al, Al:Li or Mg:Ag that has a lower work function to facilitate electron injection. Although not specifically illustrated, the organic light-emitting layer 12 is comprised of a hole injection layer, a hole transport layer, an emission layer, an electron transport layer, and an electron injection layer that are sequentially stacked on the first electrode 11 acting as the anode.

According to this structure, when a forward voltage is induced between the first electrode 11 acting as the anode and the second electrode 13 acting as the cathode, electrons migrate from the second electrode 13 to the emission layer through the electron injection layer and the electron transport layer, while holes migrate from the first electrode 11 to the emission layer through the hole injection layer and the hole transport layer. The electrons and the holes that have migrated into the emission layer recombine with each other, thereby generating excitons. These excitons transit from an excited state to a ground state, thereby emitting light. The brightness of the emitted light is proportional to the amount of current that flows between the first electrode 11 acting as the anode and the second electrode 13 acting as the cathode.

When the OLED 10 is a white OLED used for lighting, the light-emitting layer may have a multilayer structure comprised of a high-molecular light-emitting layer that emits blue light and a low-molecular light-emitting layer that emits orange-red light, or may have a variety of other structures that emit white light.

According to an embodiment, the organic light-emitting layer 12 may have a tandem structure. In this case, a plurality of organic light-emitting layers 12 alternating with interconnecting layers may be provided.

The light extraction substrate 100 according to the exemplary embodiment provided to improve the light extraction efficiency of the OLED device includes a base substrate 110, a number of light-scattering elements 120, a cover matrix layer 130, and a planarization layer 140.

The base substrate 110 is a substrate supporting the number of light-scattering elements 120, the cover matrix layer 130, and the planarization layer 140 disposed on one surface thereof. In addition, the base substrate 110 is disposed in the front portion of the OLED device, i.e. on one surface of the OLED 10, through which light generated by the OLED 10 exits, to allow generated light to pass therethrough while acting as an encapsulation substrate protecting the OLED 10 from the external environment.

The base substrate 110 may be any transparent substrate that has superior light transmittance and mechanical properties. For example, the base substrate 110 may be formed from a polymeric material, such as a thermally or ultraviolet (UV) curable organic film. Alternatively, the base substrate 110 may be formed from chemically strengthened glass, such as soda-lime glass ($SiO_2$—$CaO$—$Na_2O$) or aluminosilicate glass ($SiO_2$—$Al_2O_3$—$Na_2O$). When the OLED device including the OLED 10 and the light extraction substrate 100 according to the exemplary embodiment of the present disclosure is used for lighting, the base substrate 110 may be formed from soda-lime glass. The base substrate 110 may also be a metal oxide substrate or a metal nitride substrate. Alternatively, the base substrate 110 may be a flexible substrate, more particularly, a thin glass sheet having a thickness of 1.5 mm or less. The thin glass sheet may be manufactured using a fusion process or a floating process.

The number of light-scattering elements 120 are disposed on the base substrate 110. The number of light-scattering elements 120 may be a number of light-scattering particles. The number of light-scattering elements 120 may be arranged or provided on the base substrate 110 by, for example, mixing a material of the cover matrix layer 130 with the number of light-scattering elements 120 in a sol-gel method and then applying the resultant mixture to the base substrate 110. Alternatively, the number of light-scattering elements 120 may be provided on the base substrate 110 before the cover matrix layer 130 is formed, by a process separate from the process of forming the cover matrix layer 130. The number of light-scattering elements 120 according to the exemplary embodiment may be a number of light-scattering voids. When the number of light-scattering elements 120 are the number of light-scattering voids, the number of light-scattering elements 120 may be formed during a firing process for forming the cover matrix layer 130 from the material of the cover matrix layer 130 in which thermally curable polymer particles are mixed. The number of light-scattering elements 120 are formed in sites occupied by the thermally curable polymer particles before evaporation.

As described above, the number of light-scattering elements 120 according to the exemplary embodiment may be a number of light-scattering particles or a number of light-scattering voids. In addition, the number of light-scattering elements 120 may be a combination of particles and voids that are combined in a predetermined ratio.

The number of light-scattering elements 120 that may have a variety of shapes as described above are eventually dispersed within the cover matrix layer 130.

According to an embodiment, the number of light-scattering elements 120, more particularly, the number of light-scattering particles, may be formed from a material having the same refractive index as or a different refractive index from the cover matrix layer 130. In particular, the number of light-scattering particles may be formed from a material having a lower refractive index than the cover matrix layer 130. For example, the number of light-scattering elements 120 may be formed from a metal oxide having a lower refractive index than the cover matrix layer 130, depending on the material of the cover matrix layer 130, the metal oxide being selected from among $SiO_2$, $TiO_2$, and $Al_2O_3$. According to an embodiment, the number of light-scattering elements 120 may be a number of spherical nanoparticles, in particular, having a diameter of 50 nm to 1 μm.

The number of light-scattering elements 120 disposed on the base substrate 110 and dispersed within the cover matrix layer 130 form an internal light extraction layer (ILEL) for the OLED 10 together with the cover matrix layer 130 and the planarization layer 140. Specifically, the number of light-scattering elements 120 are formed from a material having a lower refractive index than the cover matrix layer 130 to form different refractive index portions from the cover matrix layer 130. This can consequently diversify paths along which light beams generated by the OLED 10 exit, thereby improving the light extraction efficiency of the OLED device. When the number of light-scattering elements 120 and the cover matrix layer 130 are formed from materials having the same refractive index, the planarization layer 140 is formed from a material having a different refractive index, thereby achieving differences in refractive index.

When the number of light-scattering elements 120 is distributed in a wider area within the cover matrix layer 130, the light extraction efficiency is more improved. Thus, the number of light-scattering elements 120 according to the exemplary embodiment may have a packing density of 40% or higher within the cover matrix layer 130.

The number of light-scattering particles may have multiple refractive indices. For example, each of the number of light-scattering particles may have a core-shell structure comprised of a core and a shell that provide different refractive indices. In the core-shell structure, the core may be a hollow portion. When the number of light-scattering particles have the core-shell structure, the different refractive indices of the core and the shell can further improve the efficiency with which light generated by the OLED 10 is extracted.

In a case in which all of the number of light-scattering elements 120 are light-scattering particles, the entirety of the number of light-scattering elements 120 dispersed within the matrix layer 130 may be particles having a core-shell structure or particles having a single refractive index. Alternatively, the number of light-scattering elements 120 may be a mixture of multiple refractive particles, such as core-shell particles, each having multiple refractive indices and single refractive particles, each having a single refractive index.

The cover matrix layer 130 is a layer fixing the number of light-scattering elements 120 on the base substrate 110. In this regard, the cover matrix layer 130 is disposed on the base substrate 110 in a configuration covering the number of light-scattering elements 120 disposed on the base substrate 110.

The cover matrix layer 130 is formed from a material having a different refractive index from at least one of the number of light-scattering elements 120 and the planarization layer 140 to improve the light extraction efficiency of the OLED device based on a difference in refractive indices. In particular, the cover matrix layer 130 according to the exemplary embodiment may form a high-refractive index (HRI) matrix layer having a higher refractive index than the number of light-scattering elements 120 and the planarization layer 140. The cover matrix layer 130 may be formed from one or a combination of at least two selected from a group of metal oxides, consisting of $SiO_2$, $TiO_2$, $ZrO_x$, $ZnO$, and $SnO_2$, or may be formed from HRI polymer. For example, when the number of light-scattering elements 120 are $SiO_2$ particles, the cover matrix layer 130 may be formed from $TiO_2$ having a refractive index of 2.3.

Figure 5:
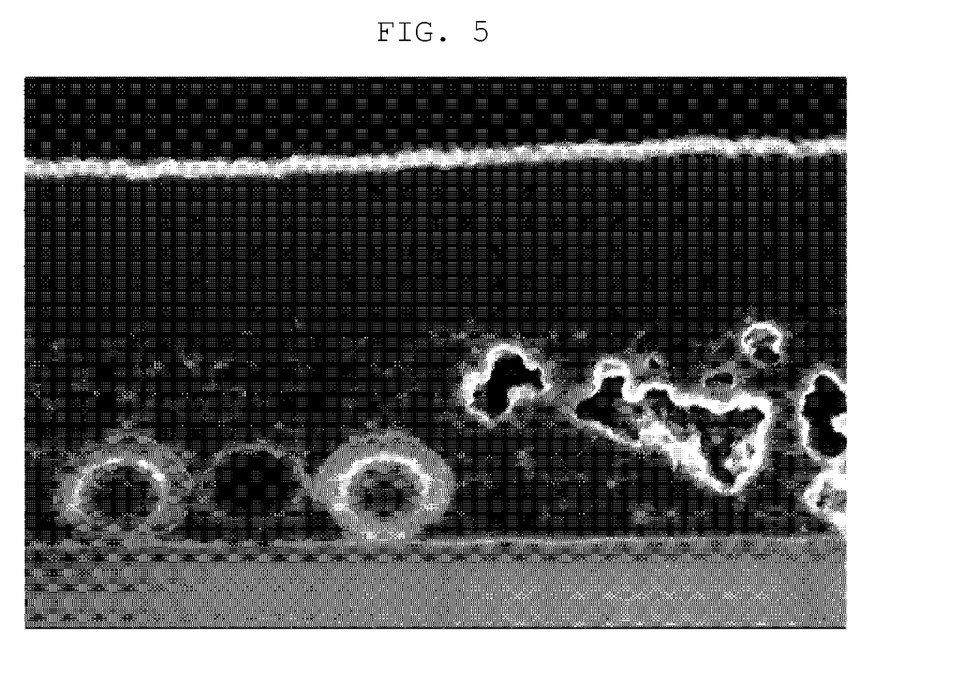
FIG. 5 is a scanning electron microscope (SEM) image taken from a matrix layer formed from rutile $TiO_2$.

As illustrated in the scanning electron microscope (SEM) image in FIG. 5, when the cover matrix layer 130 is formed from rutile $TiO_2$, a number of irregular-shaped voids having sizes of about 50 nm to about 900 nm are formed within $TiO_2$, during a $TiO_2$ firing process for forming the cover matrix layer 130. The number of voids form a complicated light-scattering structure together with the number of light-scattering elements 120, thereby improving the light extraction efficiency of the OLED device. The number of voids can produce a light-scattering effect equal to or higher than the number of light-scattering elements 120. The more irregular-shaped voids are formed within the cover matrix layer 130 formed from rutile $TiO_2$, i.e. the greater the area occupied by the number of voids in the cover matrix layer 130 is, the greater the degree of light extraction efficiency is. As described above, the increased number of voids formed within the cover matrix layer 130 can decrease the required amount of relatively expensive light-scattering elements 120, thereby reducing manufacturing costs.

According to an embodiment, the cover matrix layer 130, formed of an HRI matrix layer having a higher refractive index than the number of light-scattering elements 120 and the planarization layer 140 as described above, may have a thickness smaller than the thickness, i.e. the diameter, of the number of light-scattering elements 120. Thus, according to an embodiment, the cover matrix layer 130 may be formed at a thickness of 10 nm to 500 nm. As illustrated in the drawings, when the cover matrix layer 130 is formed in this thickness range, the number of light-scattering elements 120 form an array of convex lenses on the surface of the cover matrix layer 130. The array of lenses diversifies the paths of light beams generated by the OLED 10, like the number of light-scattering elements 120, thereby improving the light extraction efficiency of the OLED device. According to the exemplary embodiment, the optimized multilayer structure comprised of the number of light-scattering elements 120 and the cover matrix layer 130 can maximize the scattering efficiency of light generated by the OLED 10, thereby improving the light extraction efficiency of the OLED device.

The planarization layer 140 is disposed on the cover matrix layer 130. The planarization layer 140 forms the internal light extraction layer (ILEL) of the OLED 10 together with the cover matrix layer 130 and the number of light-scattering elements 120 dispersed within the cover matrix layer 130. The surface of the planarization layer 140 formed on the cover matrix layer 130 abuts the OLED 10, more particularly, the first electrode 11 of the OLED 10 acting as the anode of the OLED 10. Since the surface of the planarization layer 140 abuts the first electrode 11, i.e. the transparent electrode acting as the anode of the OLED 10, as described above, the surface of the planarization layer 140 is required to be a high flat surface to prevent the electrical characteristics of the OLED 10 from degrading. When the planarization layer 140 is formed on the cover matrix layer 130, the array of lenses formed on the surface of the cover matrix layer 130 due to the number of light-scattering elements 120 may impart textured features to the surface of the planarization layer 140. To prevent this problem, the planarization layer 140 may be formed at a sufficient thickness such that the surface thereof is not influenced by the array of lenses. Thus, according to an embodiment, the thickness of the planarization layer 140 may range from 50 nanometers to several micrometers.

According to an embodiment, the planarization layer 140 may be formed from a material having the same refractive index as or a different refractive index from the cover matrix layer 130 to maximize the light extraction efficiency of the OLED device. For example, when the planarization layer 140 is formed from a material having a different refractive index from the cover matrix layer 130, the planarization layer 140 may be formed from a metal oxide, such as $SiO_2$ or $TiO_2$, or HRI polymer. Here, materials selectable for the planarization layer 140 are limited to materials having a lower refractive index than the material of the cover matrix layer 130. In this case, the planarization layer 140 may be formed from a material having the same refractive index as the number of light-scattering elements 120. However, according to the exemplary embodiment, the material of the planarization layer 140 is not specifically limited to the same material as the number of light-scattering elements 120, since the planarization layer 140 is only required to be formed from a material having a lower refractive index than the cover matrix layer 130 such that the refractive index thereof differs from the refractive index of the cover matrix layer 130. For example, when the planarization layer 140 and the number of light-scattering elements 120 are formed from materials having lower refractive indices than the cover matrix layer 130, the refractive index of the planarization layer 140 may be different from the refractive index of the number of light-scattering elements 120. That is, the planarization layer 140 may be formed from a material having a different refractive index from the number of light-scattering elements 120.

Accordingly, in the light extraction substrate 100 for an OLED according to the exemplary embodiment, at least one layer from among the number of light-scattering elements 120, the cover matrix layer 130, and the planarization layer 140 is provided as a different refractive index layer.

When the internal light extraction layer having a multiple refractive index multilayer structure, such as a low/high refractive index structure, a high/low refractive index structure, or a low/high/low refractive index structure, is provided on a path, along which light generated by the OLED 10 exits, different refractive index layers can improve the efficiency with which light generated by the OLED 10 is extracted. The multilayer structure of the internal light extraction layer serves to increase the effect of improving the light extraction efficiency of the OLED device, based on the improved light scattering effect produced by the array of lenses of the number of light-scattering elements 120 and the cover matrix layer 130.

Figure 2:
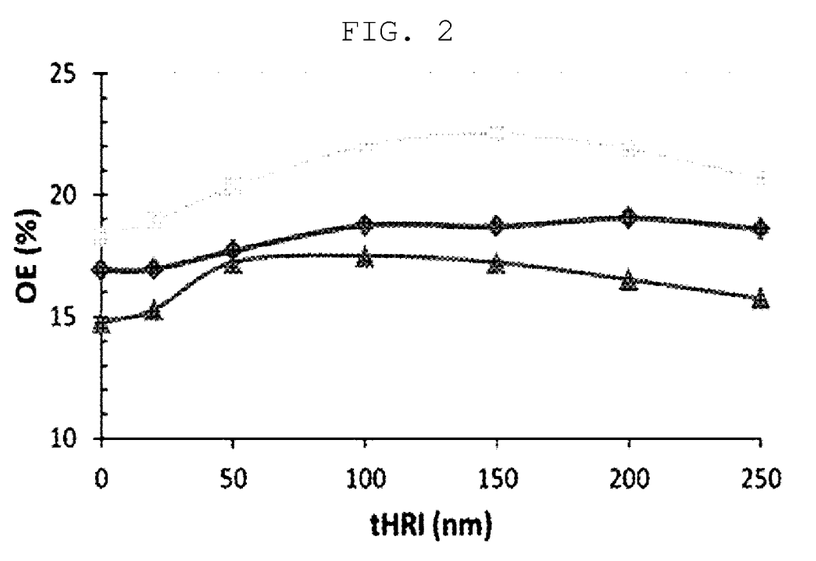
FIG. 2 is a graph illustrating results of optical analysis for an OLED device including a light extraction substrate according to an exemplary embodiment.

FIG. 2 is a graph illustrating results of optical analysis for an OLED device when the light extraction substrate having the above-described structure according to the exemplary embodiment is used in the OLED device. In this case, $SiO_2$ particles having a diameter of 200 nm were used as light-scattering elements, a cover matrix layer having a high refractive index was formed from $TiO_2$ having a refractive index of 2.3, a planarization layer was formed from $SiO_2$, the same material as of the light-scattering elements. Referring to the graph of FIG. 2, it can be appreciated that the efficiency of the OLED device varies depending on the thickness tHRI of the cover matrix layer. In particular, it can be appreciated that the efficiency of the OLED device was the highest when the thickness of the cover matrix layer was smaller than 200 nm, i.e. the diameter of the light-scattering elements. The yellow, red, and blue lines in the graph represent the wavelength-specific variations in the light extraction efficiency of the OLED device according to the thickness tHRI of the matrix layer, indicating that the thickness tHRI of the cover matrix layer exhibiting the highest efficiency according to the wavelength can be selected.

Figure 3:
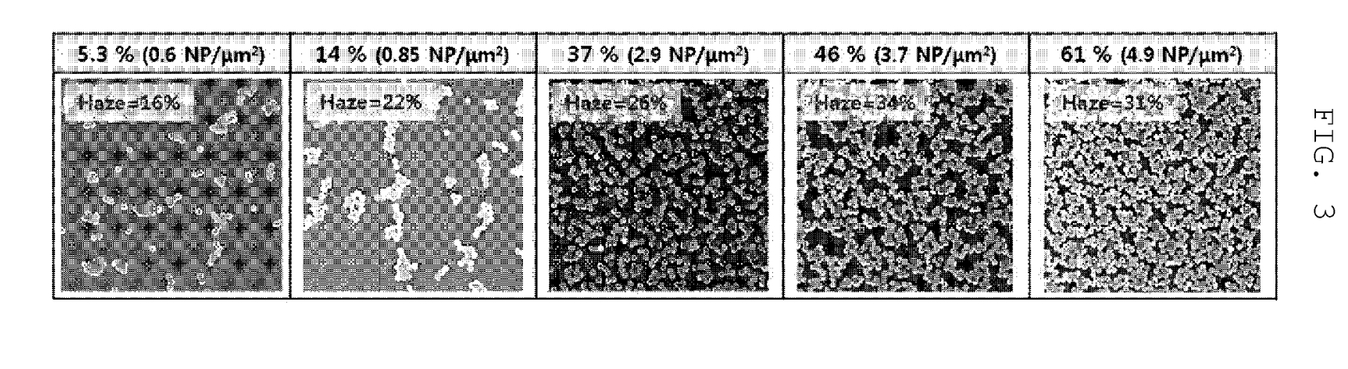
FIG. 3 illustrates modeling results for five types of internal light extraction layers having different packing densities (PD) of light-scattering elements.
Figure 4:
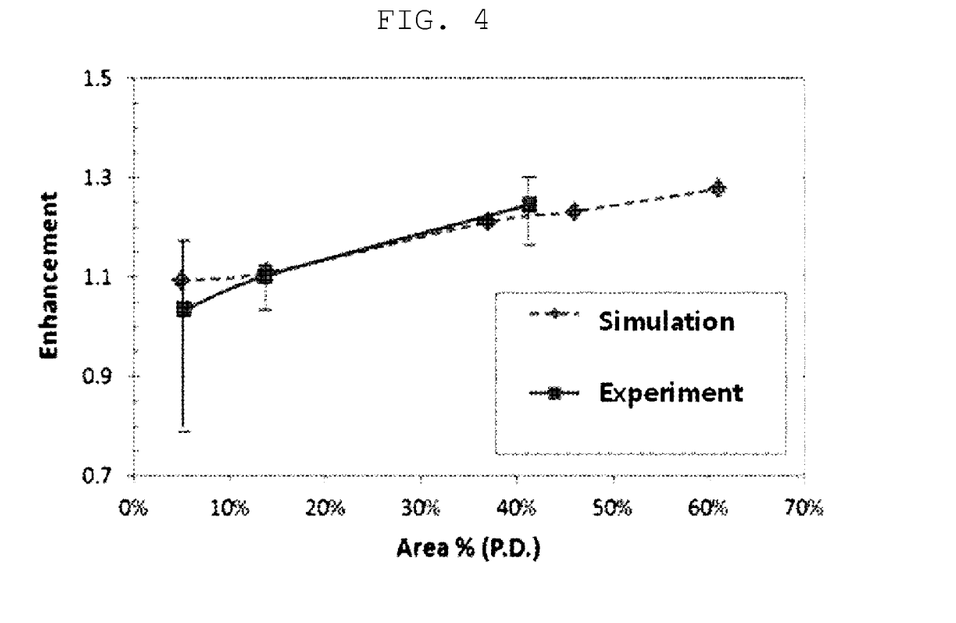
FIG. 4 is a graph illustrating light extraction efficiencies according to packing densities of light-scattering elements, compared to the modeling results in FIG. 3.

In addition, FIGS. 3 and 4 are graphs illustrating modeling and test results for five types of internal light extraction layers, in which a number of light-scattering elements have different packing densities, to determine the correlation between the packing density and the light extraction efficiency of the number of light-scattering elements distributed within a cover matrix layer. First, referring to FIG. 3, it can be appreciated that haze values increase with increases in the packing density of the number of light-scattering elements. However, when the packing density of the number of light-scattering elements exceeds 50%, the haze values decrease. In addition, referring to FIG. 4, it can be appreciated that the light extraction efficiency increases with increases in the packing density of the number of light-scattering elements.

The foregoing descriptions of specific exemplary embodiments of the present disclosure have been presented with respect to the drawings. They are not intended to be exhaustive or to limit the present disclosure to the precise forms disclosed, and obviously many modifications and variations are possible for a person having ordinary skill in the art in light of the above teachings.

It is intended therefore that the scope of the present disclosure not be limited to the foregoing embodiments, but be defined by the Claims appended hereto and their equivalents.

The invention claimed is:

1. A light extraction substrate for an organic light-emitting diode device, comprising: a base substrate; a number of light-scattering particles disposed on the base substrate, the number of light-scattering particles producing a first light-scattering effect; a cover matrix layer disposed on the base substrate to cover the number of light-scattering particles; and a planarization layer disposed on the cover matrix layer, with a surface thereof abutting an organic light-emitting diode, wherein at least one of the number of light-scattering particles, the cover matrix layer, and the planarization layer has a different refractive index, wherein the cover matrix layer is formed entirely from rutile $TiO_2$ and includes a number of differently-shaped voids formed in the rutile $TiO_2$, wherein the light-scattering elements are $SiO_2$ particles, wherein sizes of the number of differently-shaped voids range from 50 nm to 900 nm, the number of differently shaped voids producing a second light-scattering effect, the second light-scattering effect being equal to or greater than the first light-scattering effect, and wherein the number of light-scattering particles have a packing density of 40% or more within the cover matrix layer.

2. The light extraction substrate of claim 1, wherein a thickness of the cover matrix layer is lower than a thickness of the number of light-scattering particles.

3. The light extraction substrate of claim 2, wherein a thickness of the cover matrix layer ranges from 10 nm to 500 nm.

4. The light extraction substrate of claim 1, wherein diameters of the number of light-scattering particles range from 50 nm to 1 μm.

5. The light extraction substrate of claim 1, wherein the number of light-scattering particles and the planarization layer are formed from materials having a same refractive index.

6. The light extraction substrate of claim 1, wherein the number of light-scattering particles and the planarization layer are formed from materials having different refractive indices.

7. The light extraction substrate of claim 1, wherein the number of light-scattering elements and the cover matrix layer are formed from materials having a same refractive index, and the cover matrix layer and the planarization layer are formed from materials having different refractive indices.

8. The light extraction substrate of claim 1, wherein the cover matrix layer and the planarization layer are formed from materials having a same refractive index.

9. The light extraction substrate of claim 1, wherein the number of light-scattering particles, the cover matrix layer, and the planarization layer are disposed between the base substrate and the organic light-emitting diode to form an internal light extraction layer for the organic light-emitting diode.

10. The light extraction substrate of claim 1, wherein each of the light-scattering particles has a single refractive index or multiple refractive indices.

11. The light extraction substrate of claim 10, wherein the number of light-scattering particles comprise a combination of single refractive particles having a single refractive index and multiple refractive particles having multiple refractive indices.

12. The light extraction substrate of claim 11, wherein each of the multiple refractive particles comprises a core and a shell surrounding the core, the shell having a different refractive index from the core.

13. The light extraction substrate of claim 12, wherein the core comprises a hollow portion.

14. The light extraction substrate of claim 1, wherein the base substrate comprises a flexible substrate.

15. The light extraction substrate of claim 14, wherein the base substrate comprises a thin glass sheet having a thickness of 1.5 mm or less.

16. An organic light-emitting diode device comprising:
   a cathode;
   an organic light-emitting layer stacked on the cathode;
   an anode stacked on the organic light-emitting layer; and
   the light extraction substrate, as claimed in claim 1, disposed on the anode,
   wherein the planarization layer abuts the anode, and
wherein the planarization layer, the number of light-scattering particles, and the cover matrix layer form an internal light extraction layer.

* * * * *